(12) United States Patent
Edelstein et al.

(10) Patent No.: US 7,327,033 B2
(45) Date of Patent: Feb. 5, 2008

(54) COPPER ALLOY VIA BOTTOM LINER

(75) Inventors: Daniel C. Edelstein, White Plains, NY (US); Edward C. Cooney, III, Jericho, VT (US); John A. Fitzsimmons, Poughkeepsie, NY (US); Jeffrey P. Gambino, Westford, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/710,828

(22) Filed: Aug. 5, 2004

(65) Prior Publication Data

US 2006/0027930 A1    Feb. 9, 2006

(51) Int. Cl.
*H01L 23/52* (2006.01)

(52) U.S. Cl. .................. 257/751; 257/753; 257/762; 257/E23.141

(58) Field of Classification Search ........ 257/750–766, 257/E23.141
See application file for complete search history.

(56) References Cited

U.S. PATENT DOCUMENTS

| | | | |
|---|---|---|---|
| 6,090,710 A | 7/2000 | Andricacos et al. | |
| 6,181,012 B1 | 1/2001 | Edelstein et al. | |
| 6,368,961 B1 * | 4/2002 | Lopatin et al. | 438/653 |
| 6,376,353 B1 | 4/2002 | Zhou et al. | |
| 6,399,496 B1 | 6/2002 | Edelstein et al. | |
| 6,589,874 B2 | 7/2003 | Andricacos et al. | |
| 6,633,085 B1 * | 10/2003 | Besser et al. | 257/774 |
| 6,884,329 B2 * | 4/2005 | Wang et al. | 204/192.3 |
| 6,955,986 B2 * | 10/2005 | Li | 438/687 |
| 2002/0121703 A1 | 9/2002 | Toyoda et al. | |

* cited by examiner

*Primary Examiner*—Marcos D. Pizarro
(74) *Attorney, Agent, or Firm*—Whitham, Curtis, Christofferson & Cook, PC; Yuanmin Cai

(57) ABSTRACT

Improved mechanical and adhesive strength and resistance to breakage of copper integrated circuit interconnections is obtained by forming a copper alloy in a copper via/wiring connection in an integrated circuit while minimizing adverse electrical effects of the alloy by confining the alloy to an interfacial region of said via/wiring connection and not elsewhere by a barrier which reduces or substantially eliminates the thickness of alloy in the conduction path. The alloy location and composition are further stabilized by reaction of all available alloying material with copper, copper alloys or other metals and their alloys.

2 Claims, 3 Drawing Sheets

COPPER ALLOY VIA BOTTOM LINER

BACKGROUND OF INVENTION

The present invention generally relates to semiconductor integrated circuit structures and, more particularly, to electrical interconnection structures formed of copper in integrated circuit devices.

Well-recognized improvements in performance, functionality and economy of manufacture have led to integrated circuit designs at extreme levels of device density and reduced size of electronic structures, such as transistors and capacitors, and conductive interconnections between them. At the same time, higher clock rates have increased requirements for low resistance of interconnection structures and reduced capacitive coupling between them in order to reduce signal propagation time while subjecting such structures to increased thermal cycling, often of increased severity. Moreover, increased integration density places more stringent requirements for reliability of interconnections on structures of increased complexity with increased numbers of regions which may be relatively more subject to failure, possibly causing failure of an entire device.

In the past few years, copper has been substituted for aluminum in selected structures or layers or even throughout high performance integrated circuits to achieve reduced connection resistance, good mechanical strength and more rapid signal propagation even though copper has relatively poor adhesive strength to other materials and vice-versa unless complex and special processing is employed and which may result in compromise of electrical properties. In some cases, recently developed insulating materials having a low dielectric constant (e.g. below 4.0), referred to as low-k materials, have also been used.

However, the low bulk resistance of copper, as well as its mechanical strength, can be compromised by contamination or additional materials provided, for example, to increase adhesion between layers and/or reduce electromigration of conductor material. Low-k materials can also be subject to contamination, particularly in regard to materials that may cause corrosion of copper and may also cause mismatches of thermal expansion coefficients that can impose increased mechanical stresses on copper conductors and thus may drive breakage of weak vias. As the via-line contact from one interconnect level to another involves several intermediate processing steps between the respective metallizations, including breaking the vacuum, depositing a cap and interlayer dielectric, etching, stripping, cleaning and the like, there is significant opportunity for contamination and/or oxidation of this interface.

As such, the predominant yield and defect reliability defect failure mechanism in all types of multi-level on-chip metallization schemes tends to be at this via-line interface. That is, the layered nature of integrated circuit devices tends to increase the possibility of contamination of surfaces and/or alloying of materials with unpredictable results which may be contrary to the result intended or which may, for example, improve electro-migration or adhesion properties while degrading bulk resistance or vice-versa. Properties of alloys can also change radically with relative concentration of alloying materials and unreacted materials may diffuse and cause such changes in concentration during thermal cycling.

For example, alloying tin, indium and/or magnesium and the like with copper to reduce electro-migration without adversely affecting bulk resistance has been attempted. However, it has been found that such alloying materials getter contaminants such as sulfur and oxygen which increase bulk resistance by alloy scattering and may impede copper grain growth after electroplating, for further resistance increase. In other cases, differing solubility of alloying materials in copper or copper in other materials has required complex processing to regulate alteration of alloy composition or other undesirable effects such as copper precipitation.

In summary, while copper interconnections and via structures can potentially provide greatly improved performance by reducing signal propagation time, that performance enhancement may be compromised and the likelihood of a number of failure modes is increased due to the strong tendency toward compromised adhesion to copper as well as difficulty of avoiding or regulating reaction of copper with other materials which may cause increase of bulk resistance or adhesive weakness or both. Such weakness, tending to cause breakage, or increased bulk resistance is generally encountered at the interface of interconnection and via structures where different materials may be layered and/or contamination is most likely and where it is most difficult to avoid reaction of copper without substantial increase of processing complexity. This problem is common, albeit to differing degrees, to all multi-level metallization schemes such as aluminum, silver, gold and tungsten.

SUMMARY OF INVENTION

It is therefore an object of the present invention to provide a structure which provides increased strength and reliability of interconnect and via structures, particularly at their connections with no significant impact on bulk resistance or processing complexity.

In order to accomplish these and other objects of the invention, a barrier is provided adjacent a layer of alloying material to confine the alloying material within a small, shallow region of the metal or metal alloy on only one side of an interface between layers and not elsewhere. The alloy may be formed as the alloying material is deposited (e.g. at a high temperature) or later by heat treatment such as annealling to consume all available alloying material to stabilize the location and composition of the alloyed region. The barrier as well as the alloyed region also serves to avoid the metal or metal alloy on either side of the interface from sourcing further alloying beyond the shallow region at the interface between metal of metal alloy of respective layers.

Thus, in accordance with one aspect of the invention, an integrated circuit is provided including a first layer having metal or metal alloy at a surface thereof, a second layer adjacent said surface having a metal or metal alloy via therein, an interlayer connection between metal or metal alloy of the first layer and the metal or metal or metal alloy of the second layer comprising an alloy region restricted to an interfacial region of the first layer and the second layer by a barrier layer.

In accordance with another aspect of the invention, a method of forming a connection between metal or metal alloy at a surface of a first layer and a metal or metal alloy via of a second layer is provided, comprising steps of depositing an alloying material, and forming a copper alloy confined to an interfacial region of the first layer and the second layer by a barrier.

BRIEF DESCRIPTION OF DRAWINGS

The foregoing and other objects, aspects and advantages will be better understood from the following detailed description of a preferred embodiment of the invention with reference to the drawings, in which.

DETAILED DESCRIPTION

Figure 1:
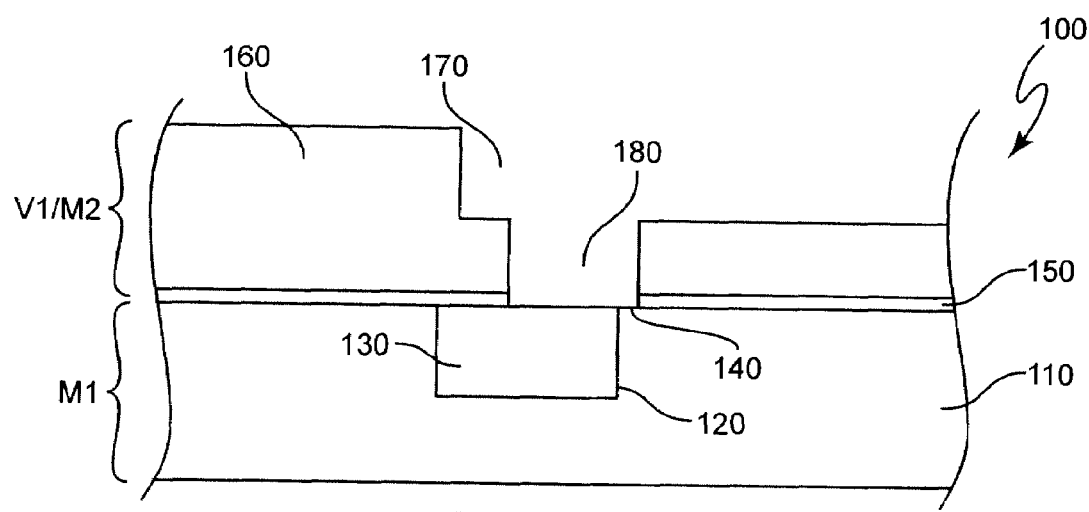
FIGS. 1, 2 and 3 are cross-sectional views of a process for forming a first embodiment of the invention.
Figure 2:
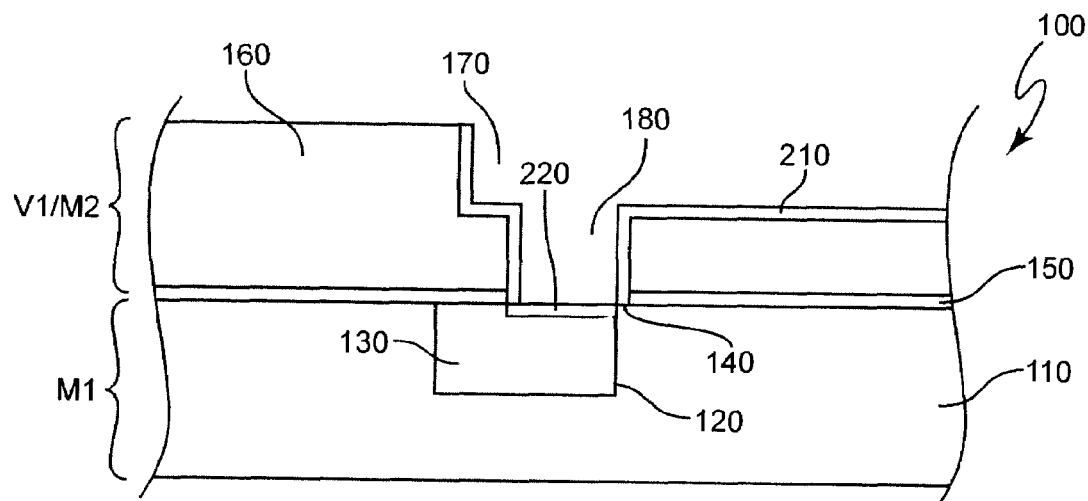
Figure 3:
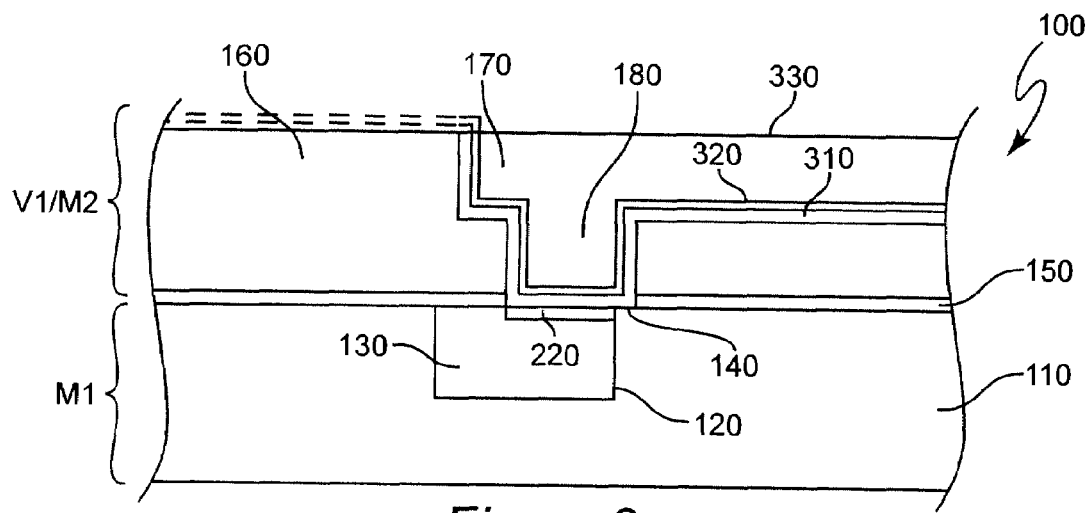

Referring now to the drawings, and more particularly to FIGS. 1-3, there is shown, in cross-section, the process of forming a first embodiment 100 of the invention.

It should be borne in mind during the following discussion of different embodiments of the invention, that the basic principle of the invention is to form a copper alloy of desired properties selectively and in a location which is restricted to the interface of via and interconnect (sometimes referred to hereinafter as wire or wiring structures but such terminology is not intended to include a discrete wire such as may be bonded to a chip for off-chip connections) structures and not elsewhere. This is achieved, in accordance with the most basic principles of the invention, by use of two liner layers of alloying and barrier materials, respectively.

The alloying material layer provides an easily regulated amount of alloying material which is, preferably, entirely reacted with copper to form a graded and thus highly stable alloy composition distribution with stable desired properties. The alloy region also has graded mechanical properties which tends to distribute stresses applied thereto, reducing potential tendencies toward metal fatigue at via/wiring interfaces due to thermal cycling. Typically, the alloying diffusion is limited to at most one diffusion length beyond the reaction front where a fully stoichiometric alloy has formed. In many alloying systems such as Cu/Sn or Cu/In bronzes, the resulting alloy also acts as a diffusion barrier against the further penetration of alloying element or copper through the stoichiometrically formed alloy layer.

The barrier layer further confines and regulates the diffusion and reaction of the alloying material during annealing to form the desired alloy and thus further enhances the stability of the alloy composition distribution and location as well as reducing the thickness of the alloy region to limit adverse effects of resistance of the alloy region. In the case where the alloying film is not removed from regions away from the via-line (reacted) contact area, the barrier is necessary to separate the alloying film from subsequent copper fill throughout the vias and interconnection trenches on the upper dual-Damascene level.

Only the via-line contact area is allowed to react to form the alloy, and in the case of the first and second embodiment of the invention, the copper reactant is sourced from the line below the via-line interface or, in the case of the third embodiment, the copper reactant is sourced from the via above the interface. In the case where the unreacted alloying film is selectively removed, the remaining material is fully reacted and may not act as a significant source for further diffusion or reaction with the copper above. The liner/diffusion barrier is still necessary in its role for avoiding copper diffusion outside the barrier. The confinement of the alloy also avoids detrimental effects on wire and via resistance which would be caused by copper consumption after alloy formation in non-restricted areas.

Broadly, FIGS. 1-3 show the formation of one wiring layer above another layer which may be the surface of a nearly completed chip (e.g. after formation of active devices) or another wiring layer. The lower layer, as illustrated, is depicted as a wiring layer (which, if it is the lowest wiring level would be referred to as the first metal or M1 layer), for simplicity and comprises an insulating material, often referred to as an interlayer dielectric (ILD) layer 110 having trenches 120 formed therein which are filled with copper 130. Such a wiring structure is referred to as a Damascene conductor and is much preferred for copper wiring/interconnects since it structurally supports the copper and can be fabricated with good precision because trenches may be formed more accurately than copper can be otherwise patterned. However, the invention is equally applicable to interconnect structures formed by other techniques, and for interconnects of other base metals such as aluminum, gold, silver and tungsten.

The layer to be formed thereon is also a wiring layer and is connected to the lower (M1) layer by vias and thus, if placed on an M1 layer, would be identified as a V1/M2 layer since it would be the first layer with vias and the second layer with metal interconnects. The wiring/via structures of the second (V1/M2) layer are depicted as so-called dual-Damascene structures since two different patterning processes are employed in forming the different depths of the trenches and via apertures. However, other structures could be employed to which the invention is equally applicable.

As will be understood by those skilled in the art, any layer overlaid on another is subject to registration or "overlay" errors 140 which are illustrated to indicate that the invention may be practiced without engendering any sensitivity or criticality in regard to the presence or magnitude of such errors. On the contrary, it should be evident from the illustration of overlay errors that the cross-sectional area of the interface of the vias of the V1/M2 layer and the interconnects of the M1 layer may be substantially reduced by such errors and mechanical weakness and increased resistance engendered thereby. Therefore it should also be appreciated that the confinement of alloying in accordance with the invention provides increased mechanical strength where it is most needed without significantly further compromising low resistance connections. As illustrated in FIG. 1, a layer 150 is provided (in the case of copper but generally not in the case of aluminum or tungsten) over the M1 layer. This barrier layer is preferably an insulator of silicon nitride, silicon carbide or the like which can function as both a barrier, particularly when a low-k material that is particularly subject to diffusion of moisture is used as the ILD, and an etch stop for the subsequent via level and is sometimes referred to as a cap layer or (somewhat inaccurately) as a copper cap. The ILD layer 160 is then formed and patterned as both a barrier to copper out-diffusion and, particularly, to form the wiring trenches 170 and via openings 180 in accordance with the chip design. The cap layer provides substantial convenience as an etch stop in this process and then opened using the patterned ILD layer as a mask using a process well-understood in the art. Then, as shown in FIG. 2, a layer or film of alloying material 210 is applied, preferably by sputtering at high temperature, to form an alloy with exposed copper as it is deposited. A high temperature process is much preferred to assure that all alloying material deposited on exposed copper 130 is reacted with the copper as it is deposited, as illustrated at 220, 50 that no unreacted alloying material will remain at the trench bottom where it might be available to diffuse into and alloy with the copper at a later time.

The alloying material can be freely chosen to provide the desired conductivity and mechanical properties and tin, indium, nickel, gold, silver, aluminum, beryllium, tellurium, magnesium, zinc, zirconium and the like are considered suitable for practice of the invention. The thickness of the alloying material liner component should be chosen to provide the desired alloying material concentration. The deposition temperature should be chosen in consideration of the deposition rate and diffusion rate of the alloying material in copper to achieve the desired gradation of alloying material composition. The unreacted alloying material can then be removed, as illustrated in FIG. 3, (e.g. by wet or dry etching), as is generally preferred since it could provide a source, albeit small, of additional alloying material, if left in place. Also, if left in place, it displaces interconnect volume that could otherwise (and more preferably) be occupied by copper. Finally, as it is in contact with the interlevel dielectric material on the via and trench sidewalls and trench bottoms, it may not be desirable from the standpoint of adhesion, diffusion, corrosion, leakage and the like compared with the more typical diffusion barrier in contact with the dielectric at these interfaces. Then, as shown in FIG. 3, the barrier layer 310 component of the liner is deposited. The barrier layer is preferably of tantalum, tungsten or titanium or alloys or nitrides thereof (although a barrier of one or more layers of other conductive materials is possible) and should be as thin as possible consistent with providing a barrier to diffusion of the alloying material. Most preferred is a bilayer of TaN/Ta. The barrier layer 310 is then preferably followed by a seed layer 320 and copper 330 to form the dual Damascene conductor and via is applied, preferably by electroplating. The excess metal films remaining on the top surface are removed by chemical mechanical planarization (CMP) back to the ILD layer 160 to complete the conductor layer in accordance with the invention.

It should be noted that the alloying layer, barrier layer, seed layer and plated copper layer need not be patterned since portions of these layers on the upper surface of ILD layer 160 are removed by the planarization of the copper 330. It should also be appreciated that the region in which the alloy material 220 is located is stabilized at a very small thickness and cannot extend upward due to barrier layer 310 and is laterally confined to the interface between copper wiring 130 and the via portion of copper wiring 330 where the additional adhesive strength is needed for highly reliable via connections while minimizing any effects of higher resistivity of the alloy material.

Figure 4:
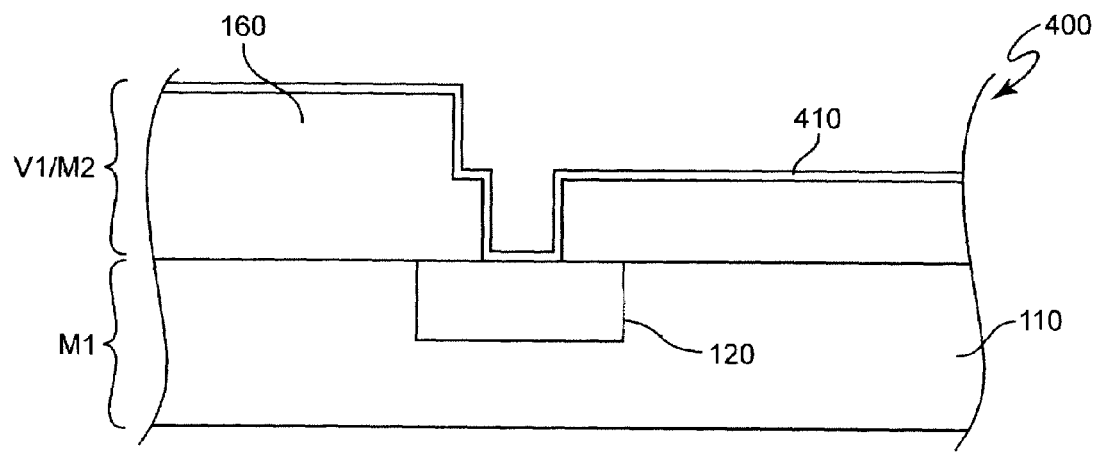
FIGS. 4, 5 and 6 are cross-sectional views of a process for forming a second embodiment of the invention.

Referring now to FIG. 4, a second embodiment of the invention will now be discussed. It will be recalled that the first embodiment was described in connection with a dual Damascene wiring and via structure, it was equally applicable to other wiring and via structures where additional adhesive strength is needed. The second embodiment, however, provides substantial enhancements of the meritorious effects of the invention when applied to dual Damascene structures by even further confining the alloy region to a small annulus at the boundary of the via/wiring interface. Further, the second embodiment provides additional advantages when used with a dual Damascene process in combination with a low-k dielectric in which a barrier layer of tantalum or the like is needed to protect the low-k ILD from moisture.

In the following discussion of the second embodiment of the invention, elements which have been discussed above in connection with the first embodiment will have the same reference numeral applied thereto and discussion thereof will be correspondingly limited in regard to the second embodiment. Further, while overlay error illustrated in FIGS. 1-3 is not illustrated in connection with the second embodiment, it should be understood that the second embodiment is similarly tolerant of overlay errors, as well.

Figure 5:
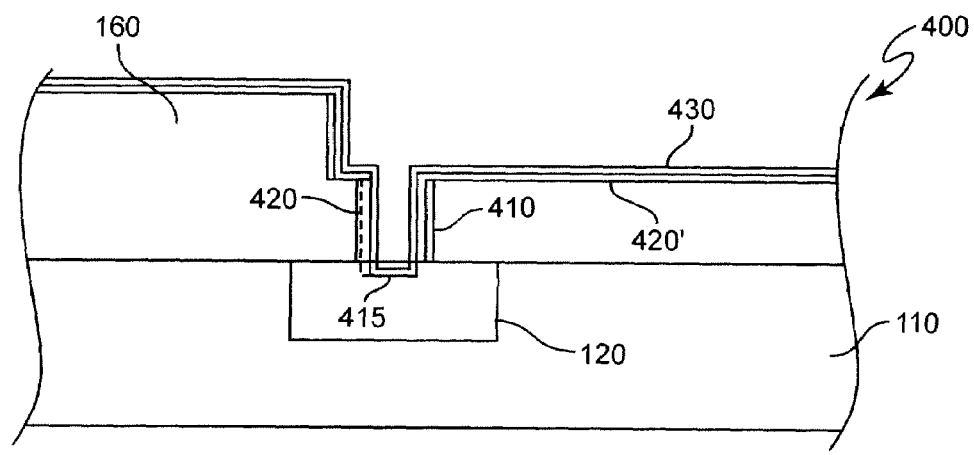
Figure 6:
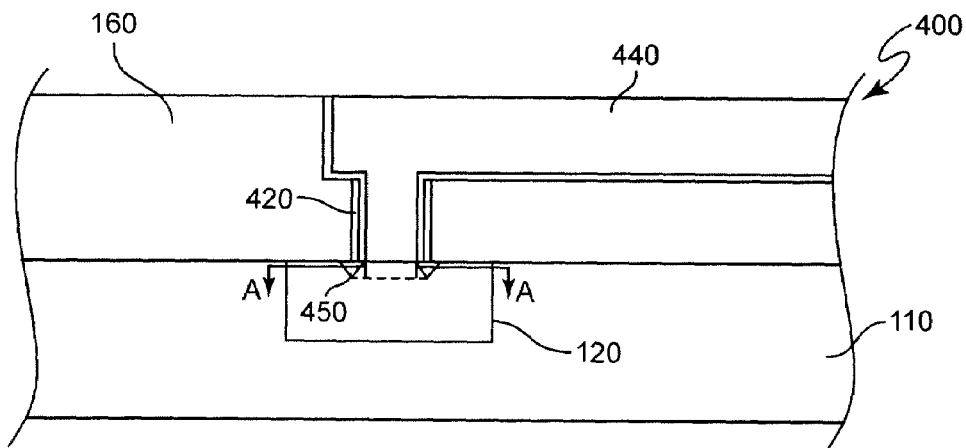

The second embodiment 400 of the invention illustrated in FIGS. 4-6 is referred to, for convenience as a "sacrificial liner" process or a "liner first" process which will now be described. Beginning with a structure topologically similar to that of FIG. 1, a liner 410 of alloying material such as those mentioned above is applied by an isotropic deposition process, preferably physical vapor deposition or sputtering. This deposition should provide a thickness of alloying material of a thickness of 50 to 500 Angstroms to provide, in view of the height of the via, a suitable volume of alloying material to form the alloy annulus of desired dimensions (e.g. to extend under the thickness of the barrier to the border of the via).

However, it is preferred that the thickness of the alloying material liner 410 be maintained as thin as possible since, in theory, a void will be formed as the alloying material is reacted. However, (without wishing to be held to any particular rationale for a phenomenon which is theoretical, has not been observed and of no discernible effect in regard to the successful practice of the invention) the development of a void, if it occurs, may be a very minuscule event and the alloying to form a very thin and shallow annulus may become stable before all alloying material is consumed possibly due to the formation of a shallow void immediately above the alloy annulus and terminating the alloying reaction. In any event, no deleterious effects attributable to a void has been observed and the dimensions of the alloy annulus are non-critical to development of improved resistance to via breakage in accordance with the invention. Therefore, the invention may be successfully practiced with any thickness of alloying material in the above range and, in effect, the noted preference for a thinner layer of alloying material is principally theoretical.

The deposition of liner 410 is followed by deposition of a barrier layer 420 of one of the above-mentioned barrier materials, preferably tantalum nitride deposited by sputtering, to a thickness also between 50 and 500 Angstroms. Again, thinner layers of barrier material (e.g. somewhat less than the diffusion length of the alloying material) are preferred to avoid consuming more of the via space than necessary and to assure that the alloy annulus which will be formed later will reach the copper in the via. The barrier layer deposition is followed by an anisotropic, vertical argon sputter etch which removes barrier 420 and liner 410 at the bottom of the trench and on other surfaces parallel to the surface of the V1/M2 layer, leaving liner 410 and barrier 420 only on the trench sidewalls, as shown in FIG. 5.

Figure 6A:
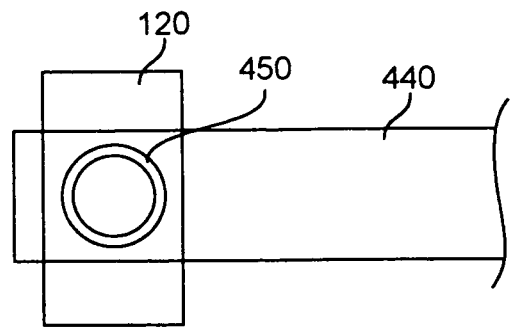
FIG. 6A is a sectional view of a portion of FIG. 6, and FIGS. 7, 8 and 9 are cross-sectional views of a process for forming a third embodiment of the invention.

Further, as shown in FIG. 5, this anisotropic etch process also optionally but preferably recesses (415) the copper of conductor 130 at the trench bottom which increases the area of the copper to copper interface and provides for current to largely bypass the alloy annulus. A tantalum second barrier layer 420' (which may be required to protect the low-k ILD, if used) and a seed layer 430 are then applied as in the first embodiment and copper 440 is applied, preferably by plating (although other processes may allow omission of the seed layer, as is well-understood in the art) and planarized. The second embodiment of the invention is completed by annealing to form an alloy annulus 450 below the sidewalls 410 as shown in FIG. 6 where the alloying material contacts the underlying copper, as limited by the barrier layer 420 (and 420'). A sectional view of the alloy annulus at section A-A is shown in FIG. 6A. The annealing can be performed at any time after barrier layer 420 is in place and annealing prior to deposition of the via copper may be preferable in some circumstances.

This process can, of course, provide many possible final structures and combinations of materials for the resulting layered structure of the sidewall and barrier, particularly when it is considered that either or both of the sidewall and the barrier structures may be multi-layer structures. Some combinations of sidewall/barrier are Sn/Ta, Ta/CuSn/Ta and Al/Ta.

In summary, the second embodiment provides increased structural integrity with reduced potential compromise of conductivity at the via-line contact since the copper via extends into a recess in the M1 conductor layer and alloy is formed at the periphery thereof where stresses due to thermal cycling will be greatest. Perhaps more importantly, the copper of the M1 layer wiring is directly adjacent to the copper of the via in the V1/M2 layer for further reduced resistance compared with the first embodiment since no alloy is interposed between the via and the connecting line.

It should be appreciated that the sacrificial liner technique can also be applied in a manner similar to the first embodiment by reversing the order of the liner 410 and barrier 420 and depositing the alloying material at a high temperature to react with the underlying copper prior to deposition of the tantalum barrier layer 420'. Alternatively, an alloy annulus can be formed using the barrier 420' instead of barrier 420 when the barrier and alloying material layer are reversed and then annealing after formation of barrier 420' or during deposition of tantalum at a high temperature.

Figure 7:
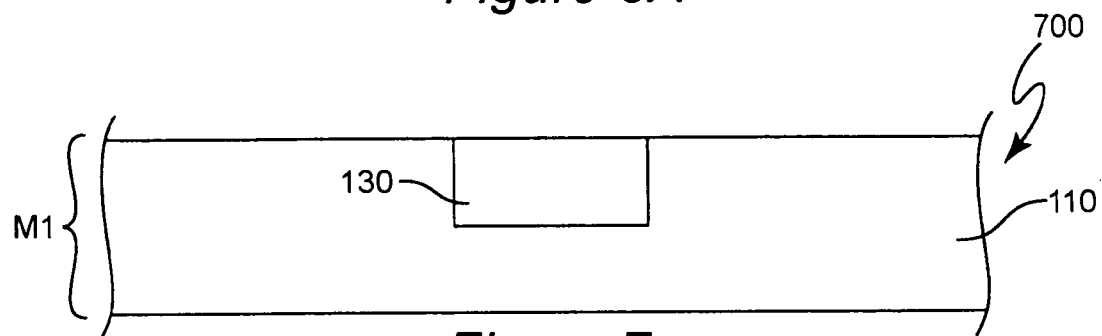
Figure 8:
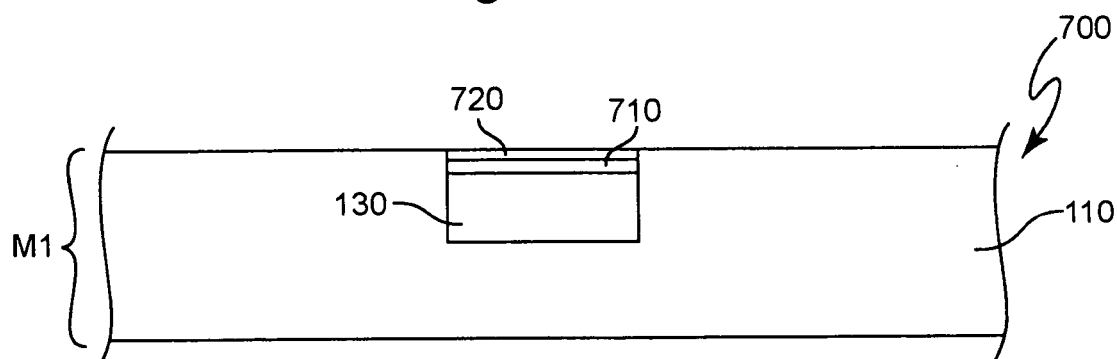
Figure 9:
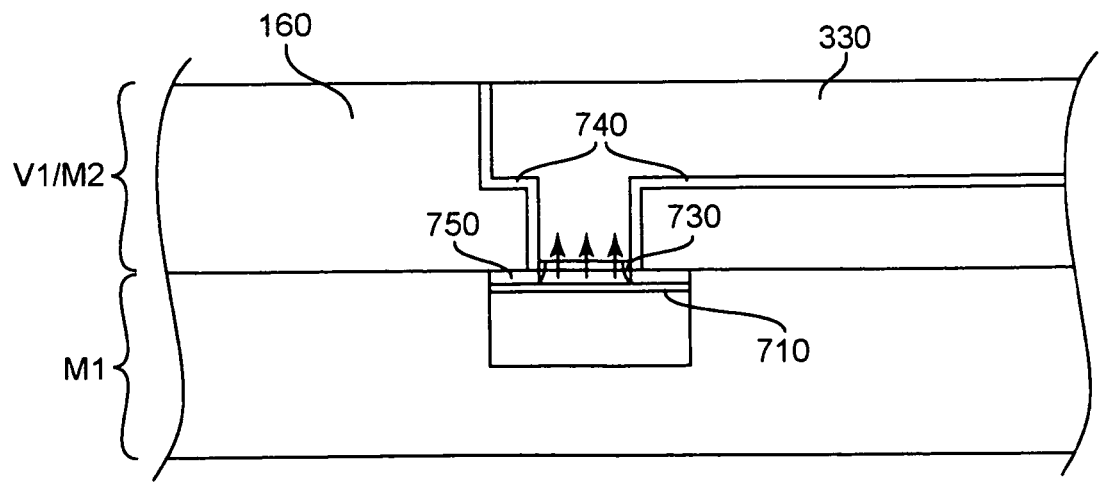

Referring now to FIGS. 7-9, a third embodiment of the invention will be discussed. The third embodiment of the invention may be generally conceptualized as an inversion of the first embodiment, described above. The third embodiment also employs the principle of confining the alloying material using a barrier layer. However, the diffusion during alloying is in the upward direction into the copper of the via in the V1/M2 layer rather than downward into the M1 layer connection. An additional difference is that the alloying element is disposed as a cap covering the top surfaces for all the interconnects on the lower level, but blocked from reacting with the interconnect material by a barrier layer. Thus the alloying material will only react in areas contacted from above by vias.

This difference may be useful in some processing circumstances and provides advantages of increased resistance to damage of the via/wiring connection as well as reduced resistance and increased stability of location and composition of alloy compared with prior processes as produced by the first and second embodiments described above. However, small quantities of unreacted alloying material may remain, the alloyed region may be slightly thicker than in the first embodiment and the processing is more complex than either the first or second embodiments of the invention. Therefore, the third embodiment is not preferred for general application but may provide the meritorious effects of the invention in structures to which the first and second embodiments cannot be applied.

FIG. 7 shows an M1 layer topologically identical to that of the first or second embodiments including, in this case, a Damascene conductor 130 supported by an insulator 110. As shown in FIG. 8, the copper wiring of the M1 layer is recessed slightly, preferably in the range of 10 to 50 nm or slightly more than the barrier layer required to control diffusion of the alloying material. Then, barrier layer 710 is deposited and a layer of alloying material 720 deposited thereover. Layers 710 and 720 are then planarized by polishing back to the original M1 layer surface or slightly beyond to achieve the desired thickness of alloying material film. The V1/M2 layer is then formed, as shown in FIG. 9, by depositing and patterning the ILD 160 and a bottomless liner 740 (where both the TaN and Ta (or other material) barrier layers are sputtered open at the via bottoms) and copper 330 deposited, preferably by plating after depositing a seed layer, as discussed above. The third embodiment of the invention is then completed by annealing to diffuse and alloy material from layer 720 with copper 330. The annealing should be carried out sufficiently to consume the entirety of layer 720 with copper 330 diffusing into the region 750 above barrier layer 710 surrounding the via while the alloying material diffuses upwardly for only a short distance 730. Thus, as in the first and second embodiments, the alloying is stabilized by consumption of the alloying material and confined to an extremely thin layer by a thin conductive barrier layer to achieve increased strength at the via/wiring interface without significant compromise of the low resistance provided by the copper wiring.

In view of the foregoing, the invention provides improved reliability of integrated circuit interlayer connections while preserving low electrical resistance by forming copper alloy of desired mechanical properties but confining the alloy to an extremely thin region at the interlayer via/wiring interfacial region and not elsewhere. The invention is not limited to copper vias and interconnects but is equally applicable to copper alloys and other metals and their alloys as well as at interfaces between different metals and/or metal alloys and in structures other than connections between lines and vias. The thickness of an alloy region is reduced or substantially avoided in the conduction path by confinement of diffusion of the alloying material to only the via or the wiring copper or to an annulus surrounding the conduction path.

While the invention has been described in terms of a single preferred embodiment, those skilled in the art will recognize that the invention can be practiced with modification within the spirit and scope of the appended claims.

The invention claimed is:

1. An integrated circuit including
   a first layer having metal or metal alloy at a surface thereof,
   a second layer adjacent to said surface having a metal or metal alloy via therein,
   an interlayer connection between metal or metal alloy of said first layer and said metal or metal alloy via comprising a stable alloy region having graded mechanical characteristics, containing a predetermined quantity of alloying material and restricted to an interfacial region of said metal or metal alloy of said first layer and said metal or metal alloy via by a barrier layer,
   wherein said metal alloy of said interlayer connection is formed as an annulus in said metal or metal alloy at a surface of said first layer.

2. The integrated circuit as recited in claim 1, wherein said via extends into said metal or metal alloy of said first layer surrounded by said annulus.

* * * * *